(12) United States Patent
Kühn et al.

(10) Patent No.: US 7,071,773 B2
(45) Date of Patent: Jul. 4, 2006

(54) DIGITAL PHASE LOCKED LOOP

(75) Inventors: Hans-Jürgen Kühn, Buchholz (DE); Manfred Zupke, Hamburg (DE)

(73) Assignee: Koninklijke Philips Electronics, N.V., Eindhoven (NL)

( * ) Notice: Subject to any disclaimer, the term of this patent is extended or adjusted under 35 U.S.C. 154(b) by 186 days.

(21) Appl. No.: 10/503,421

(22) PCT Filed: Feb. 3, 2003

(86) PCT No.: PCT/IB03/00331
§ 371 (c)(1),
(2), (4) Date: Aug. 3, 2004

(87) PCT Pub. No.: WO03/067751
PCT Pub. Date: Aug. 14, 2003

(65) Prior Publication Data
US 2006/0017498 A1      Jan. 26, 2006

(30) Foreign Application Priority Data
Feb. 7, 2002   (DE) ................. 102 05 044

(51) Int. Cl.
*H03D 3/00* (2006.01)
(52) U.S. Cl. ..................... 329/325; 329/341
(58) Field of Classification Search ........... 329/315, 329/325, 341; 348/726, 727; 375/320, 340, 375/344
See application file for complete search history.

(56) References Cited
U.S. PATENT DOCUMENTS
4,199,179 A * 4/1980 Curry ................ 292/338

FOREIGN PATENT DOCUMENTS
EP         0486095        5/1992

* cited by examiner

*Primary Examiner*—David Mis

(57) ABSTRACT

The invention relates to a digital phase locked loop (PLL) 12 for demodulating an intermediate frequency signal. The digital phase locked loop 12 comprises two coordinate rotation digital computers 24 and 30 in its phase detector. The robustness the PLL 12 can be improved by means of a gain control circuit 27, a sign detector 20, a carrier monitoring circuit 28 and an adjustable loop filter 32.

13 Claims, 2 Drawing Sheets

DIGITAL PHASE LOCKED LOOP

The invention relates to a digital phase locked loop (PLL) for demodulating an amplitude-modulated signal, in particular for an intermediate frequency modulator for broadcast signals, e.g. television signals, having a digital phase comparison circuit, a digital loop filter and a digitally controlled oscillator, the phase comparison circuit comprising a digital mixer and a phase transfer circuit.

Conventional digital phase locked loops are frequently used for the demodulation of a modulated signal. In this case, the information signal to be transmitted is demodulated from a modulated carrier signal by means of the PLL. Broadcast signals, in particular television signals, are frequently modulated by means of an amplitude modulation method. The PLL is then used in receiver circuits in order to identify the information-carrying signal from the amplitude-modulated intermediate frequency by means of synchronous demodulation with carrier regeneration.

The digital phase comparison circuit serves to compare a phase of the carrier of the amplitude-modulated input signal with a phase of a comparison signal. The comparison signal is generated via feedback of the phase comparison circuit. To this end, the output of the phase comparison circuit, which comprises the phase error between input signal and fed back signal, is passed to a controlled oscillator via a loop filter.

The controlled oscillator outputs a signal which is adjusted in phase to the input signal, so that the phase comparison circuit can filter the carrier signal. The phase comparison circuit frequently comprises a digital mixer which mixes the output of the controlled oscillator with the input signal, such that the information signal can be filtered from the carrier signal. To this end, the carrier signal phase is rotated to 0 degrees. In addition, the phase comparison circuit comprises a phase transfer circuit which converts the phase error detected by the digital mixer into a corresponding output signal by means of which the loop filter is activated.

A digital receiving circuit with a digital phase comparison circuit is disclosed in EP 0 486 095 A1. An input signal is transformed into two orthogonal signals by means of a Hilbert filter. These two signals, which are also known as in-phase signal (I path) and quadrature phase signal (Q path), are applied to the digital phase comparison circuit. A phase control signal is likewise applied to the digital phase comparison circuit. The digital phase comparison circuit mixes the two input signals with the phase comparison signal, such that an I path signal and a Q path, corrected by the carrier frequency, are present at the outputs. The phase comparison signal may be a fed back output signal of the phase comparison circuit. In this case, an amplitude-modulated received signal can be demodulated by means of the circuit shown.

However, it has been demonstrated that conventional intermediate frequency demodulators are unstable in everyday operation, in particular because in conventional operation amplitude overmodulations, low signal strengths, undesired FM/PM modulations, poor signal/noise ratios and static carrier frequency errors occur. The result thereof is that conventional PLLs may be unstable or do not supply any satisfactory demodulation results.

Therefore, a technical problem to be solved by the present invention is to ensure stable field operation of a digital PLL. A further problem to be solved by the invention is to improve the picture and sound quality in television receivers. Another problem to be solved by the invention is to reliably eliminate disturbances occurring in normal operation.

To solve these problems, the invention proposes a digital PLL in which the phase transfer circuit exhibits a periodic transfer function with a phase error of π, so that a phase shift of π arising through amplitude overmodulation of the input signal can be suppressed. In contrast to conventional phase transfer circuits, in which the transfer function is periodic in 2π, the transfer function according to the invention of the phase transfer circuit is periodic in π. A periodic transfer function of between −π/2 and π/2 is preferred. In the case of amplitude overmodulation, sign inversion of the carrier signal occurs, which results in the PLL starting to readjust the carrier signal. This is undesirable, however. According to the invention, the input signal, as represented in the vector diagram, is mirrored at the origin for all the values of the phase $$\frac{\pi}{2} < \varphi < \frac{3}{2}\pi,$$

i.e. negative real components. The output of the phase transfer circuit then always has a positive real component. In the case of amplitude overmodulation, a 180 degree phase shift does not occur in the phase transfer circuit and the PLL remains in the locked state.

A phase transfer circuit may advantageously be integrated if it takes the form as claimed in claim 2.

The transfer function preferably corresponds to claim 3. In this case, a transfer function is preferably produced which resembles a sawtooth.

The phase transfer circuit according to the invention does not perform any evaluation of the polarity of the input signal. In this way, an ambiguity arises at the output of the phase transfer circuit with regard to the polarity of the signal. This ambiguity may be resolved as claimed in claim 4. With the assistance thereof, the polarity of the input signal may be determined and the ambiguity induced by the phase transfer circuit thus resolved.

The sign detector preferably takes the form as claimed in claim 5. In the case of integration via the signal, the correct polarity of the input signal can be determined with a high degree of probability.

The problem according to the invention is solved, as further provided by the invention, by a digital PLL in which the phase locked loop is equipped, for demodulation of an amplitude-modulated signal, in particular for an intermediate frequency demodulator for broadcast signals, with a digital phase comparison circuit, a digital loop filter and a digitally controlled oscillator, the phase comparison circuit comprising a digital mixer and a phase transfer circuit, and comprises a carrier monitor, wherein a lower limit value of the magnitude of the carrier signal strength can be detected by means of the carrier monitor and wherein the phase transfer circuit can be deactivated if a lower limit value is detected. The phase error calculated by the phase transfer circuit becomes inaccurate at low signal strengths. Due, for example, to noise, an erroneous phase error is calculated, which error leads to undesired PLL activity. To avoid this, the signal strength of the carrier signal is detected by means of the carrier monitoring circuit. If the signal strength of the carrier signal drops below a given limit value with regard to magnitude, the phase transfer circuit may be deactivated. Errors arise at low strengths in particular when a Cordic operating in the linear mode is used. These lead to undesired PLL activity. However, if the phase transfer circuit, i.e. the Cordic, is deactivated, the undesired activity can be suppressed.

The activity of the PLL can advantageously be deactivated as claimed in claim 7. By setting the in-phase signal to a maximum value and the quadrature phase signal to the value zero, the output of the phase transfer circuit may be set to the value zero. This ensures that the PLL remains idle.

The problem according to the invention is likewise solved, as further provided by the invention, by a digital phase locked loop for demodulation of an amplitude-modulated signal, in particular for intermediate frequency demodulation for broadcast signals, having a digital phase comparison circuit, a digital loop filter and a digitally controlled oscillator, wherein the phase comparison circuit comprises a digital mixer and a phase transfer circuit. This digital PLL is characterized in that the digital loop filter is actively connected to a gain control circuit and in that the bandwidth of the loop filter can be set as a function of an output of the gain control circuit. The gain control circuit is preferably an Amplitude Gain Controller (AGC). If it is established by the gain control circuit that the input signal has to be amplified only slightly at the input (tuner) and the signal strength is high, noise interference has only a slight effect on the control behavior of the PLL. If, on the other hand, it is established that considerable amplification is necessary in order to amplify the input intermediate frequency signal to a sufficiently high amplitude, it should be assumed that signal noise is also amplified and has a negative effect on the PLL3 s control behavior. The lower the PLL3 s susceptibility to noise, the larger may be set the bandwidth of the loop filter, which preferably takes the form of an active low-pass (PI member).

The loop filter variation is preferably controlled as claimed in claim 10. An advantage of this is that different signal qualities may be responded to. The PLL is freed from noise by adjusting the bandwidth of the loop filter.

The problem according to the invention is likewise solved, as further provided by the invention, by a digital PLL for demodulation of an amplitude-modulated signal, in particular for an intermediate frequency demodulator for broadcast signals, having a digital phase comparison circuit, a digital loop filter and a digitally controlled oscillator, the phase comparison circuit comprising a digital mixer and a phase transfer circuit, which digital PLL is characterized in that the digital loop filter comprises a frequency locked loop, in that a gradient of the output signal of the phase transfer circuit can be determined by means of the frequency locked loop and in that the digitally controlled oscillator can be set by means of the determined gradient, wherein the phase locked loop can be brought into a locked state by setting the digitally controlled oscillator in the event of a deviation of the carrier signal frequency by 0 to 1.6 MHz from a nominal frequency. The gradient of the output signal of the phase transfer circuit provides information about how large the frequency error is between input signal and phase control signal. The digitally controlled oscillator is activated as a function of the determined gradient. In the case of a large offset between the frequency of the actual input signal and the nominal frequency, a large gradient arises, which leads to the DCO quickly runing through the frequency range. If the two frequencies approach one another, the gradient also diminishes, so that the PLL approaches the carrier signal more slowly until the locking-in range of the PLL leads to phase coincidence. Such a device is advantageously used in the case of an automatic station search.

The gradient can particularly advantageously be determined as claimed in claim 12. In the case of a digital frequency locked loop, an nth output value is compared with a preceding (n−1)th output value The difference provides information about how large the phase error is between phase control signal and carrier frequency phase. The larger the frequency error, the quicker the frequency locked loop runs through the search field of the PLL.

A digital PLL is advantageously formed as claimed in claim 13. An input signal can be mixed with a phase control signal by the Cordic in the rotation mode, such that the phase of the carrier of the input signal is rotated in the direction of zero. A Cordic is advantageous, since it does not perform any multiplications, but only shift and add operations. This reduces the complexity considerably. The Cordic also allows the input signal to be compared as in-phase signal and as quadrature phase signal with the DCO signal.

The use of an above-described phase locked loop in television receivers for television signals constitutes a further subject matter of the invention.

By means of the phase locked loop according to the invention, the error susceptibility thereof in intermediate frequency demodulators can be considerably reduced.

The invention will be further described with reference to embodiments shown in the drawings to which, however, the invention is not restricted. In the drawings.

Figure 1:
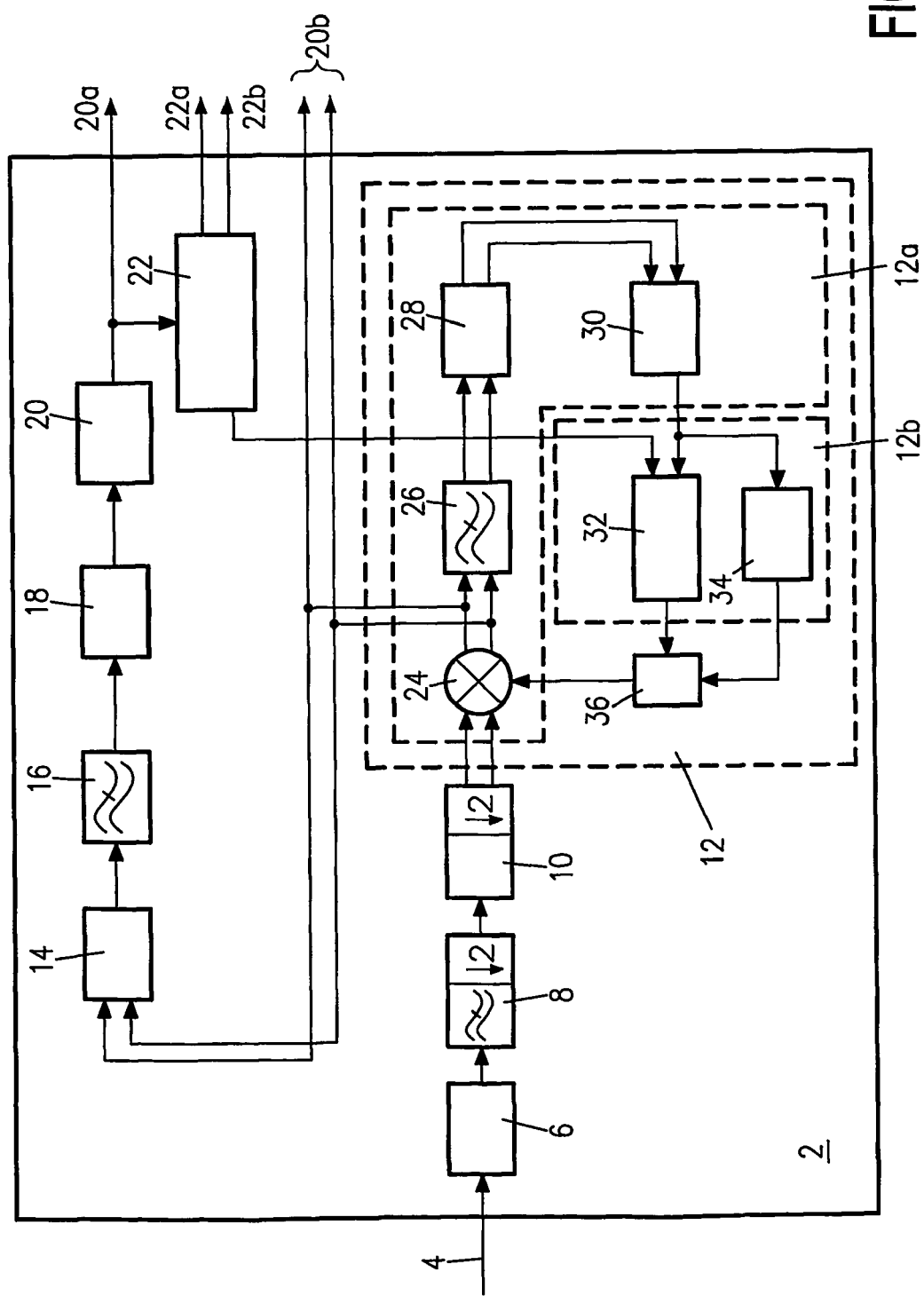
FIG. 1 shows a block diagram of an intermediate frequency demodulator according to the invention.

FIG. 1 shows a demodulator 2 for an intermediate frequency signal 4 of a tuner of a television signal receiver (not illustrated). The demodulator 2 comprises an analog/digital converter 6, a decimation filter 8, a Hilbert filter 10 and a digital phase locked loop (PLL) 12. A digital Nyquist filter 14, a low-pass filter 16, an allpass 18, a sign detector 20 and a gain control circuit 22 as well as a video output 20a, an audio output 20b, a tuner control output 22b and an intermediate frequency amplifier control output 22a are also arranged in the demodulator 2.

The digital PLL 12 comprises a Coordinate Rotation Digital Computer (Cordic) 24 in the rotation mode, a low-pass filter 26, a carrier monitoring circuit 28 and a Cordic 30 in the linear mode, which together form a phase detector 12a. The loop filter block 12b is formed from a low-pass filter 32 with adjustable bandwidth and a frequency locked loop (FLL) 34. The digital PLL 12 also comprises a Digital Controlled Oscillator (DCO) 36.

The television signal received from a receiving aerial is amplified by a tuner (not illustrated) and converted into an intermediate frequency signal. The intermediate frequency signal is amplified again by an amplitude gain controller (AGC) (not illustrated) and applied to the demodulator 2 as the intermediate frequency signal 4.

The intermediate frequency signal 4 is sampled in the demodulator 2 by means of the analog/digital converter 6 with a sampling frequency of approx. 54 MHz. The digital signal is decimated in its sampling rate by the factor 2 by the decimation filter 8 and applied to the Hilbert filter 10. The intermediate frequency signal is converted by means of the Hilbert filter 10 into two signals phase-shifted by 90 degrees. These are on the one hand an in-phase signal (I path), the phase of which corresponds to that of the intermediate frequency signal, and a quadrature phase signal (Q path), the phase of which is shifted by 90 degrees relative to the phase of the intermediate frequency signal. The I path signal and the Q path signal are applied to the digital PLL 12.

In the digital PLL 12, a reference carrier is formed from the input signal and demodulated by back rotation to 0 Hz.

First of all, the digital PLL 12 is in an unlocked state. This means that the phase and frequency of the input signal at the Cordic 24 differ from the phase and frequency of the output of the DCO 36. The output signal of the Cordic 24 is not demodulated and is first filtered via the low-pass filter 26 in order to suppress color and sound carriers.

The signal is applied to the Cordic 30 via the carrier monitoring circuit 28. This Cordic 30 performs a phase transfer. The input signal is converted into a corresponding output signal via a linear transfer function. This output signal is applied to the DCO 36 via the low-pass filter 32. The output signal of the Cordic 30 is additionally applied to the frequency locked loop 34.

In order to demodulate the input signal of the Cordic 24, the phase of the DCO 36 must be corrected to that of the input signal. The output signal of the Cordic 30 provides information about the instantaneous phase error between DCO 36 and the input signal. In order to equalize this, a control signal is formed from the output of the FLL 34 and the low-pass filter 32.

The frequency and phase of the DCO 36 are corrected by means of this control signal. By adjusting the output signal of the DCO 36, the Cordic 24 ensures that the input signal is present at its output in synchronously amplitude-demodulated state.

Figure 2:
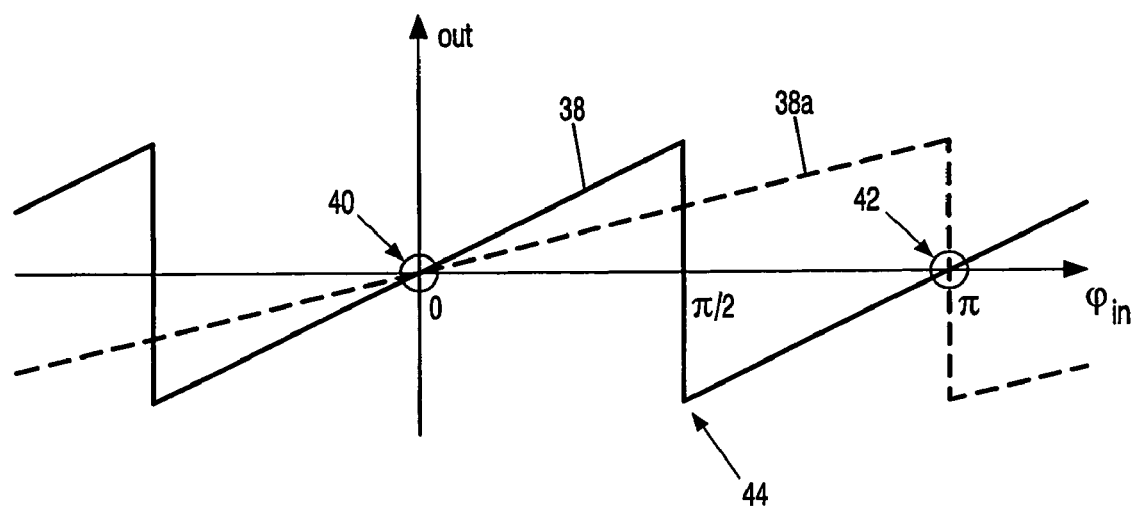
FIG. 2 shows a transfer function of a phase transfer circuit.

The Cordic 30 exhibits a transfer function 38, as illustrated in FIG. 2. The transfer function 38 is formed between $-\pi/2$ and $\pi/2$ by a ramp, which is periodic in 90, such that a sawtooth function results. The transfer function 38 exhibits a phase shift 44. In comparison to conventional transfer functions 38a, which are periodic in $2\pi$, the phase shift 44 here occurs at $\pi/2$, in contrast to the phase shift 42 with a phase error of $\pi$. In accordance with the transfer function 38, the phase error of the input signal is evaluated by the Cordic 30 in such a way that only output values with a value between $\pi/2$ and $-\pi/2$ are present. Higher phase errors are mirrored at origin. This means that the real component of the input signal is evaluated merely with regard to magnitude. In a vector representation of the input signal, the transfer function of the Cordic 30 may be interpreted in such a way that the vector of the input signal is mirrored at the zero point for negative real values.

For example, in the case of amplitude overmodulation of the input signal, a phase shift of 180 degrees occurs. Because the real component of the input signal is evaluated by the Cordic 30 only with regard to magnitude, the PLL 12 also remains idle in the event of a phase shift of 180 degrees. Amplitude overmodulation thus has no negative effect on the PLL 12.

However, since the sign of the input signal is suppressed by the Cordic 30, this has to be recovered at the output. This is achieved by means of the sign detector 20.

The sign detector 20 integrates the video signal over an entire line. Since only a small part of the total signal is modified with regard to its sign by amplitude overmodulation, this may be eliminated by integration over an entire line. Sign recovery is performed in the sign detector 20.

It frequently so happens that the envelope of the carrier signal exhibits only a low amplitude. In this case, the information signal may approach the zero transition in the case of amplitude modulation. However, this leads to errors in the Cordic 30, since this operates independently of amplitude and is susceptible to errors at low amplitudes. For this reason, at a signal level of approx. 2% around zero the Cordic 30 is deactivated. In the carrier monitoring circuit 28, the magnitude of the in-phase signal amplitude is monitored. If this drops below a limit value, the in-phase signal is set to its maximum value. This may be either the negative or positive full excursion, the sign being dependent on the respective television standard. The quadrature phase signal is set to zero. For this case, the output of the Cordic 30 is zero, which results in the phase of the DCO 36 not being readjusted.

The television signal is frequently residual sideband-modulated. During demodulation, the video signal has to be recovered from the two residual sidebands by means of the Nyquist filter 14.

Errors in the input signal, which are generated for example by noise peaks, frequently lead to undesired activity of the PLL 12. The influence of noise on the signal and the control behavior of the PLL 12 is dependent on the signal strength of the intermediate frequency signal. The greater the signal strength of the intermediate frequency signal, the lower has to be set the amplification of this signal. In this case, errors are also only slightly amplified by signal noises. By coupling the gain control circuit 22 to the low-pass filter 32, the bandwidth of the loop filter in 12b may be controlled as a function of the signal level of the intermediate frequency signal. The signal strength of the black level of the video signal indicates the signal strength of the intermediate frequency signal. The signal strength of the synchronization signal is monitored by the gain control circuit 22.

The result of the gain control circuit 22 is communicated on the one hand, via the intermediate frequency amplifier output 22a, to the intermediate frequency amplifier which accordingly amplifies the intermediate frequency signal. On the other hand, it is communicated to the low-pass filter 32. This adjusts its bandwidth as a function of the measured signal strength. The greater the signal strength, the less significant the influence of signal noise. In this case, the bandwidth of the low-pass filter 32 may be selected to be large. If the signal strength is low, signal noise is also amplified in the intermediate frequency amplifier together with the intermediate frequency signal. This noise leads to undesired control of the PLL 12 if the bandwidth of the loop filter 12b is selected to be too large. Therefore, where the signal strength is low, the bandwidth of the low-pass filter 32 is selected to be small. By controlling the bandwidth of the low-pass filter 32, the PLL may be freed of noise. The PLL reacts less to signal noise.

When setting a receiving channel, the entire search frequency is run through by the PLL 12. In such a situation, the DCO 36 is activated by the loop filter 32 and the FLL 34. The greater the difference between the frequency of the DCO 36 and that of the input signal at the Cordic 24, the steeper is the phase error signal which is present at the output of the Cordic 30. The slope of the output signal of the Cordic 30 is measured by the FLL 34. The frequency of the DCO 36 is corrected as a function of this gradient. In this way, lock-in of the carrier is possible even in the case of a large frequency offset of for example 1.6 MHz. This allows a fast station search.

LIST OF REFERENCE NUMERALS

2 Demodulator
4 Intermediate frequency signal
6 Analog/digital converter
8 Decimation filter
10 Hilbert filter
12 Digital phase locked loop (PLL)
12a Phase detector 12b Loop filter block
14 Digital Nyquist filter
16 Low-pass filter
18 Allpass
20 Sign detector
22 Gain control circuit
22a Intermediate frequency amplifier output
22b Tuner control output
24 Cordic
26 Low-pass
28 Carrier monitoring circuit
30 Cordic
32 Low-pass/loop filter
34 Frequency locked loop (FLL)
36 Digital controlled oscillator (DCO)
38 Transfer function of the Cordic 30
40 Operating point
42 Overmodulation point
44 Phase shift
38a Transfer function of a conventional phase transfer circuit

The invention claimed is:

1. A digital phase locked loop (PLL) for demodulation of an amplitude-modulated signal, in particular for an intermediate frequency demodulator for broadcast signals, having a digital phase comparison circuit, a digital loop filter, and a digitally controlled oscillator, the phase comparison circuit comprising a digital mixer and a phase transfer circuit, characterized in that the phase transfer circuit comprises a periodic transfer function with a phase error of $\pi$, so that a phase shift of $\pi$ arising through amplitude overmodulation of the input signal can be suppressed.

2. A digital phase locked loop as claimed in claim 1, characterized in that the phase transfer circuit takes the form of a Coordinate Rotation Digital Computer (Cordic) in the linear mode.

3. A digital phase locked loop as claimed in claim 1, characterized in that the transfer function of the phase transfer circuit is linear.

4. A digital phase locked loop as claimed in claim 1, characterized in that a sign detector is arranged downstream of the phase locked loop, wherein the polarity of the video signal can be determined from the output signal by means of the sign detector.

5. A digital phase locked loop as claimed in claim 4, characterized in that the sign detector comprises an integrator, wherein the output signal can be integrated by means of the integrator and the polarity of the video signal can be determined from the output signal.

6. A digital phase locked loop as claimed in one of claim 1, characterized in that the phase comparison circuit takes the form of a Coordinate Rotation Digital Computer (Cordic) in the rotation mode.

7. A digital phase locked loop for demodulation of an amplitude-modulated signal, in particular for an intermediate frequency demodulator for broadcast signals, having a digital phase comparison circuit, a digital loop filter, and a digitally controlled oscillator, the phase comparison circuit comprising a digital mixer and a phase transfer circuit, characterized in that the phase locked loop comprises a carrier monitoring circuit, wherein a lower limit value of the magnitude of the carrier signal strength can be detected by means of the carrier monitoring circuit and wherein the phase transfer circuit can be deactivated if a lower limit value is detected.

8. A digital phase locked loop as claimed in claim 7, characterized in that the magnitude of the lower limit value is between 0 and 10% of the maximum amplitude of the carrier signal strength.

9. A digital phase locked loop as claimed in claim 8, characterized in that the carrier monitoring circuit comprises an input for an in-phase signal (I path) and an input for a quadrature phase signal (Q path), in that the in-phase signal can be evaluated by means of the carrier monitoring circuit and in that the quadrature phase signal can be set to the value 0 if the lower limit value is reached by the in-phase signal and the in-phase signal can be set to a maximum signal amplitude.

10. A digital phase locked loop for demodulation of an amplitude-modulated signal, in particular for an intermediate frequency demodulator for broadcast signals, having a digital phase comparison circuit, a digital loop filter, and a digitally controlled oscillator, the phase comparison circuit comprising a digital mixer and a phase transfer circuit, characterized in that the digital loop filter is actively connected to a gain control circuit and the bandwidth of the loop filter can be set as a function of an output of the gain control circuit.

11. A digital pase locked loop as claimed in claim 10, characterized in that, if a large gain is detected by the gain control circuit, the bandwidth of the loop filter can be reduced and in that, if a small gain is detected by the gain control circuit, the bandwidth of the loop filter can be enlarged.

12. A digital phase locked loop for demodulation of an amplitude-modulated signal, in particular for an intermediate frequency demodulator for broadcast signals, having a digital phase comparison circuit, a digital loop filter, and a digitally controlled oscillator, the phase comparison circuit comprising a digital mixer and a phase transfer circuit, characterized in that the digital loop filter comprises a frequency locked loop (FLL), a gradient of the output signal of the phase transfer circuit can be determined by means of the frequency locked loop and the digitally controlled oscillator can be set by means of the determined gradient, wherein the phase locked loop may be brought into a locked state by adjusting the digitally controlled oscillator in the event of deviation of the carrier signal frequency by 0 to 1.6 MHz from a nominal frequency.

13. A digital phase locked loop as claimed in claim 12, characterized in that the frequency locked loop takes the form of a digital circuit, in that the output signal of the phase transfer circuit is formed from a sequence of digital encoded individual values and in that the gradient can be calculated by means of successive indiviual values.

* * * * *